United States Patent
Kim et al.

(10) Patent No.: US 9,455,690 B2
(45) Date of Patent: Sep. 27, 2016

(54) HALF-POWER BUFFER AND/OR AMPLIFIER

(71) Applicant: Dongbu HiTek Co., Ltd., Bucheon-si (KR)

(72) Inventors: Mun Gyu Kim, Gyeongsangbuk-do (KR); Sun Young Lee, Uijeongbu-si (KR); Jeong Tae Park, Yongin-si (KR); Seung Jin Yeo, Seoul (KR)

(73) Assignee: Dongbu HiTek Co., Ltd., Bucheon-si (KR)

( * ) Notice: Subject to any disclaimer, the term of this patent is extended or adjusted under 35 U.S.C. 154(b) by 0 days.

(21) Appl. No.: 14/820,182

(22) Filed: Aug. 6, 2015

(65) Prior Publication Data

US 2016/0173065 A1 Jun. 16, 2016

(30) Foreign Application Priority Data

Dec. 11, 2014 (KR) .......................... 10-2014-0178167

(51) Int. Cl.
*H03K 3/012* (2006.01)
*H03F 3/21* (2006.01)

(52) U.S. Cl.
CPC ............... *H03K 3/012* (2013.01); *H03F 3/211* (2013.01); *H03F 2200/555* (2013.01)

(58) Field of Classification Search
CPC .................................. H03K 3/012; H03F 3/21
See application file for complete search history.

(56) References Cited

U.S. PATENT DOCUMENTS

| 8,638,164 B2 | 1/2014 | Son et al. |
| 8,963,586 B2 * | 2/2015 | Acar ................ H03K 19/00315 327/109 |
| 2011/0169808 A1 | 7/2011 | Son et al. |

FOREIGN PATENT DOCUMENTS

| KR | 20000075272 A | 12/2000 |
| KR | 20100028677 A | 3/2010 |

OTHER PUBLICATIONS

Young Suk Son et al.; "An Amplifier Including Dithering Switches and Display Driving Circuit Using the Amplifier"; Bibliographic Data of KR20100028677 (A); Mar. 15, 2010; http://worldwide.espacenet.com.

Bang Ho Park; "Current Amplification Circuit of Source Driving Apparatus for Thin Film Transistor Liquid Crystal Display Device"; Bibliographic Data of KR20000075272 (A); Dec. 15, 2000; 2 pgs.; http://worldwide.espacenet.com.

* cited by examiner

*Primary Examiner* — Hai L Nguyen
(74) *Attorney, Agent, or Firm* — Andrew D. Fortney; Central California IP Group, P.C.

(57) ABSTRACT

Disclosed is a half-power buffer/amplifier. The half-power buffer/amplifier includes first and second amplifying blocks respectively corresponding to first and second channels, a first output buffer unit controlled by an output from the first amplifying block, and a second output buffer unit controlled by an output from the second amplifying block. Each of the first and second amplifying blocks includes an input unit configured to amplify a first input signal, thereby outputting first and second currents, and an amplifying unit including a first current mirror, a second current mirror, and a bias unit connected between the first current mirror and the second mirror. Nodes in the first and second amplifying blocks are selectively connected to source/drain terminals of transistors in the first and second amplifying blocks in response to a control signal.

19 Claims, 5 Drawing Sheets

HALF-POWER BUFFER AND/OR AMPLIFIER

This application claims the benefit of Korean Patent Application No. 10-2014-0178167, filed on Dec. 11, 2014, which is hereby incorporated by reference as if fully set forth herein.

BACKGROUND OF THE INVENTION

1. Field of the Invention

Embodiments relate to a half-power buffer and/or amplifier.

2. Discussion of the Related Art

A liquid crystal display device generally includes pixels arranged in a matrix of rows and columns. Each pixel may include a thin film transistor and a pixel electrode formed on a substrate. Gates of thin film transistors arranged in the same row may be connected through a gate line and may be controlled by a gate driver.

Sources of thin film transistors arranged in the same column may be connected through a source line and may be controlled by a source driver.

In the case of a liquid crystal display device having increased resolution, an increased number of output buffers should be built in the source driver of the liquid crystal display device. In this case, power consumption is increased due to the increased number of buffers. In a portable appliance, power consumption of the liquid crystal display device determines available run time. For this reason, the liquid crystal display device of the portable appliance generally employs low-power buffers.

FIG. 6 shows a general half-power output buffer.

Referring to FIG. 6, in a first frame, a first buffer 11 for a first channel CH1 may output a first half power, for example, VDD2M~VDD2, as a first output VOUT1, in accordance with selective connection of a switching unit 15. At the same time, a second buffer 12 for a second channel CH2 may output a second half power, for example, VSS2~VDD2M, as a second output VOUT2, in accordance with the selective connection of the switching unit 15.

In a second frame next to the first frame, the first buffer 11 may output the first half power as the second output using the switching unit 15, and the second buffer 12 may output the second half power as the first output VOUT1. The switching unit 15 may perform a switching operation in response to an inversion polarity signal POL. The switching unit 15 may achieve dot inversion.

It may be impossible to appropriately remove offsets generated from or by the different buffers 11 and 12. As a result, display quality may degrade. For example, when offset directions of the first buffer 11 and second buffer 12 are opposite, the offset characteristics may accumulate. Although offset characteristics may be reduced by increasing a matching pair size, an increase in chip area may occur as a result.

SUMMARY OF THE INVENTION

Embodiments of the present invention provide a half-power buffer and/or amplifier capable of preventing generation of an abnormal output upon polarity inversion.

Additional advantages, objects, and features of various embodiments will be set forth in part in the description which follows and in part will become apparent to those skilled in the art upon examination of the following or may be learned from practice of the embodiments. The objectives and other advantages of the disclosed embodiments may be realized and attained by the structures particularly pointed out in the written description and claims hereof as well as the appended drawings.

To achieve these objects and other advantages and in accordance with the purpose(s) of the disclosed embodiments, as embodied and broadly described herein, a half-power buffer and/or amplifier includes first and second amplifying blocks respectively corresponding to first and second channels, a first output buffer unit controlled by an output from the first amplifying block, and a second output buffer unit controlled by an output from the second amplifying block, wherein each of the first and second amplifying blocks includes an input unit configured to amplify a first input signal and output first and second currents, and an amplifying unit including a first current mirror including first and second transistors connected in series at a first node, configured to receive the first current, third and fourth transistors connected in series at a second node, configured to receive the first current or a complement thereof, a second current mirror including fifth and sixth transistors connected in series at a third node, configured to receive the second current, and seventh and eighth transistors connected in series at a fourth node, configured to receive the second current or a complement thereof, and a bias unit connected between the first current mirror and the second mirror, wherein the second and fourth nodes of the first and second amplifying blocks are selectively connected to first source/drain terminals of the fourth and eighth transistors in the first and second amplifying blocks in response to a control signal. The first input signal may be a differential input signal, and the first and second currents may be first and second differential currents.

Each of the first and second output buffer units may include an N type transistor and a P type transistor, connected in series. The first output buffer unit may be connected at one end thereof to a second supply voltage, and at another end thereof to a third supply voltage, and the second output buffer unit is connected at one end thereof to a first supply voltage, and at another end thereof to the third supply voltage. The second supply voltage may be higher than the third supply voltage, and the first supply voltage may be lower than the third supply voltage.

The bias unit may include a first bias circuit connected between the second transistor of the first current mirror and the sixth transistor of the second current mirror, and a second bias circuit connected between the fourth transistor of the first current mirror and the eighth transistor of the second current mirror.

The control signal may be an inversion polarity signal.

The second and fourth nodes of the first amplifying block may be selectively connected to the first source/drain terminals of the fourth and eighth transistors of the second amplifying block. The second and fourth nodes of the second amplifying block may be selectively connected to the first source/drain terminals of the fourth and eighth transistors of the first amplifying block.

The second and fourth nodes of one of the first and second amplifying blocks may be selectively connected to the first source/drain terminals of the fourth and eighth transistors in one of the first and second amplifying blocks in response to the control signal. The second and fourth nodes of the other of the first and second amplifying blocks may be selectively connected to the first source/drain terminals of the fourth and eighth transistors in the other of the first and second amplifying blocks in response to the control signal.

An output from each of the first and second output buffer units may be fed back to a corresponding one of the first and second input units.

Each of the first and second current mirrors may be or comprise a cascade current mirror.

Each of the first and second bias circuits may include an N type transistor and a P type transistor connected in parallel, and each of gates of the N type and P type transistors may receive a bias voltage.

The half-power buffer and/or amplifier may further include a first switch connected between the second node of the first amplifying block and the first source/drain terminal of the fourth transistor in the first amplifying block, a second switch connected between the fourth node of the first amplifying block and the first source/drain terminal of the eighth transistor in the first amplifying block, a third switch connected between the second node of the first amplifying block and the first source/drain terminal of the fourth transistor in the second amplifying block, a fourth switch connected between the fourth node of the first amplifying block and the first source/drain terminal of the eighth transistor in the second amplifying block, a fifth switch connected between the second node of the second amplifying block and the first source/drain terminal of the fourth transistor in the second amplifying block, a sixth switch connected between the fourth node of the second amplifying block and the first source/drain terminal of the eighth transistor in the second amplifying block, a seventh switch connected between the second node of the second amplifying block and the first source/drain terminal of the fourth transistor in the first amplifying block, and an eighth switch connected between the fourth node of the second amplifying block and the first source/drain terminal of the eighth transistor in the first amplifying block. The first to eighth switches may perform switching operation in response to the control signal.

In another aspect, a half-power buffer and/or amplifier includes first and second amplifying blocks respectively corresponding to first and second channels, a first output buffer unit controlled by first and second output nodes, and a second output buffer unit controlled by third and fourth output nodes, wherein each of the first and second amplifying blocks includes an input unit configured to amplify a first input signal and output first and second currents, a first current mirror including first and second transistors connected in series between a second supply voltage and a first intermediate node and in series at a first node, configured to receive the first current, a third transistor connected between the second supply voltage and a second node, configured to receive the first current or a complement thereof, a fourth transistor connected to the first output node, the first and third transistors being connected at gates thereof, the second and fourth transistors being connected at gates thereof, the first transistor being connected at the gate thereof to the first intermediate node, a second current mirror including fifth and sixth transistors connected in series between a first supply voltage and a second intermediate node at a third node, configured to receive the second current, a seventh transistor connected between the first supply voltage and a fourth node, configured to receive the second current or a complement thereof, an eighth transistor connected to the second output node, the fifth and seventh transistors being connected at gates thereof, the sixth and eighth transistors being connected at gates thereof, the fifth transistor being connected at the gate thereof to the second intermediate node, and a bias unit connected between the first intermediate node and the second intermediate node and between the first output node and the second output node, wherein the second and fourth nodes of each of the first and second amplifying blocks are selectively connected to first source/drain terminals of the fourth and eighth transistors in a corresponding one of the first and second amplifying blocks. The first input signal may be a differential input signal, and the first and second currents may be first and second differential currents.

The second node of the first amplifying block may be connected to the first source/drain terminal of the fourth transistor in one of the first and second amplifying blocks in response to the control signal. The fourth node of the first amplifying block may be connected to the first source/drain terminal of the eighth transistor in one of the first and second amplifying blocks in response to the control signal. The second node of the second amplifying block may be connected to the first source/drain terminal of the fourth transistor in the other of the first and second amplifying blocks in response to the control signal. The fourth node of the second amplifying block may be connected to the first source/drain terminal of the eighth transistor in the other of the first and second amplifying blocks in response to the control signal.

The half-power buffer and/or amplifier may further include a switching unit configured to selectively connect the second and fourth nodes to the first source/drain terminals of the fourth and eighth transistors in response to the control signal.

The first output buffer unit may include a P type transistor and an N type transistor, connected in series between the second supply voltage and a third supply voltage. The second output buffer unit may include a P type transistor and an N type transistor, connected in series between the first supply voltage and the third supply voltage. The first and second output nodes of each of the first and second amplifying blocks may be connected to corresponding gates of the P type and N type transistors in a corresponding one of the first and second output buffer units, respectively.

The bias unit may include a first bias circuit including N type and P type transistors connected in parallel between the first intermediate node and the second intermediate node and receiving a first bias voltage, and a second bias circuit including N type and P type transistors connected in parallel between the first output node and the second output node and receiving a second bias voltage.

In accordance with various embodiments, it may be possible to prevent an abnormal output swing upon polarity inversion. It may also be possible to achieve low-power design and small-area design through use of half power.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
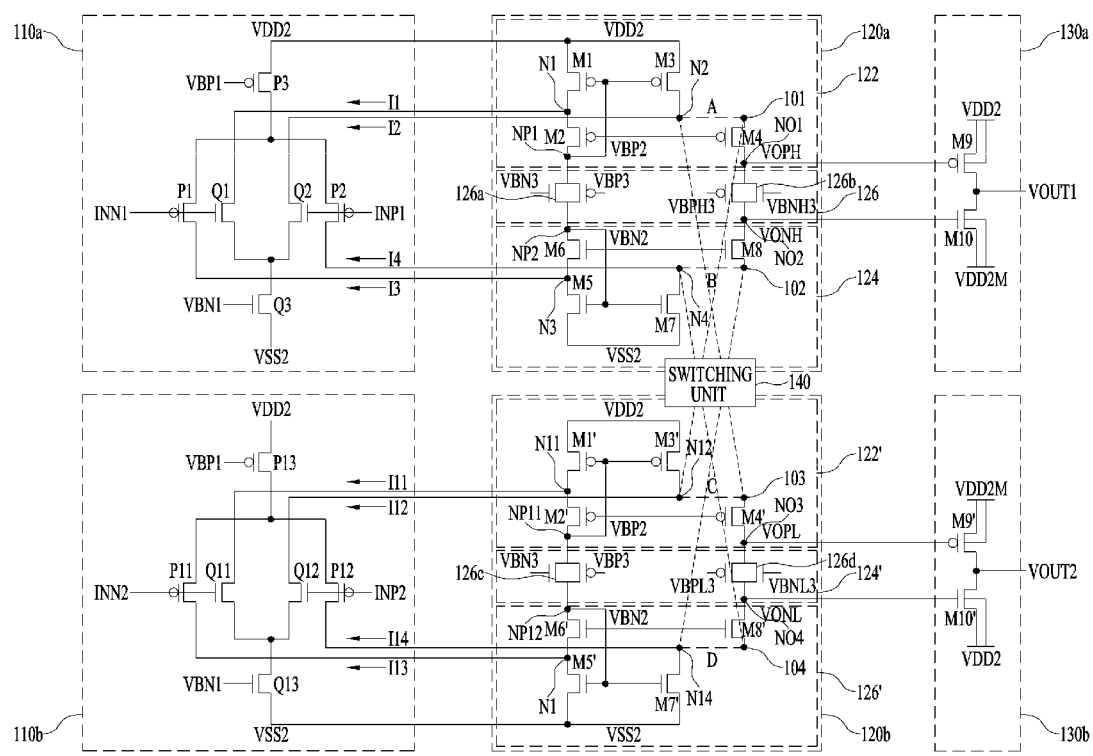
FIG. 1 is a circuit diagram illustrating a half-power buffer and/or amplifier according to an exemplary embodiment of the present invention.

Hereinafter, embodiments will be described in detail with reference to the accompanying drawings for better understanding. In the following description of various embodiments, it will be understood that, when an element such as a layer (or film), region, pattern, or structure is referred to as being "on" or "under" another element, it can be directly on or under the other element or an intervening element may also be present. In addition, terms such as "on" or "under" should be understood on the basis of the drawings.

In the drawings, dimensions of layers may be exaggerated, omitted or schematically illustrated for clarity and convenience of description. In addition, dimensions of constituent elements may not entirely reflect the actual dimensions thereof. The same reference numerals generally denote the same or similar constituent elements.

FIG. 1 illustrates a half-power buffer and/or amplifier 100 according to an exemplary embodiment of the present invention. The half-power buffer and/or amplifier 100 of FIG. 1 may be applied to a source driver of a liquid crystal display device. Of course, embodiments are not limited to such an application.

Referring to FIG. 1, the half-power buffer and/or amplifier 100 includes first and second input units 110a and 110b, first and second amplifying units 120a and 120b, first and second output buffer units 130a and 130b, and a switching unit 140. The half-power buffer and/or amplifier 100 may include a rail-to-rail amplifier. The first input unit 110a and first amplifying unit 120a may constitute a first amplifying block, whereas the second input unit 110b and second amplifying unit 120b may constitute a second amplifying block.

The term "rail" may refer to a maximum or minimum supply voltage or power source (for example, VDD2 or VCC as a maximum, and VSS2, VSS or ground as a minimum). "Rail-to-rail amplifier" may be an operational amplifier configured to receive and/or provide a voltage over a full supply voltage range (for example, from VDD2 to VSS2). An input voltage level may also be within the full range of the supply voltage.

The source driver of the liquid crystal display device may include at least one half-power buffer and/or amplifier 100 as illustrated in FIG. 1. The half-power buffer and/or amplifier 100 may provide outputs VOUT1 and VOUT2 to drive two adjacent channels of a display panel driven by the source driver. Here, "channel" may mean a data line of the source driver configured to drive pixels of the display panel.

Each of the first and second input units 110a and 110b may be or comprise a differential amplifier, such as a complementary differential amplifier. For example, each of the first and second input units 110a and 110b may include a folded cascode operational transconductance amplifier (OTA).

The first input unit 110a may amplify first and second input signals INN1 and INP1, and may generate first to fourth currents I1, I2, I3, and I4. The input signals INN1 and INP1 may be a first differential input signal. Currents I1 and I3 may be or represent a first differential current, and currents I2 and I4 may be or represent a second differential current.

The second input unit 110b may amplify third and fourth input signals INN2 and INP2, and may generate fifth to eighth currents I11, I12, I13, and I14. The input signals INN2 and INP2 may be a second differential input signal. Currents I11 and I13 may be or represent a third differential current, and currents I12 and I14 may be or represent a fourth differential current.

The first input unit 110a may include a first differential amplifier and a second differential amplifier.

For example, the first differential amplifier may include first and second NMOS transistors Q1 and Q2 having a common source configuration, and a first bias unit Q3 connected to a second rail VSS2, to control an amount of bias current supplied to or sunk from the common source of the first and second NMOS transistors Q1 and Q2 in response to a first bias voltage VBN1.

The first bias unit Q3 may be implemented using an NMOS transistor including a gate configured to receive the first bias voltage VBN1, and source and drain terminals connected between the second rail VSS2 and the common source of the first and second NMOS transistors Q1 and Q2. The second rail VSS2 may supply a first supply voltage (for example, a ground potential).

The second differential amplifier may include first and second PMOS transistors P1 and P2 having a common source configuration, and a second bias unit P3 connected to a first rail VDD2, to control an amount of bias current supplied to or sunk from the common source of the first and second PMOS transistors P1 and P2 in response to a second bias voltage VBP1. The second bias unit P3 may be implemented using a PMOS transistor including a gate configured to receive the second bias voltage VBP1, and source and drain terminals connected between the first rail VDD2 and the common source of the first and second PMOS transistors P1 and P2.

The first rail VDD2 may supply a second supply voltage (for example, 5V, 3V, 2.5V 1.8V, etc.) higher than the first supply voltage VSS2.

The first input signal INN1 may be supplied to the gates of the first NMOS transistor Q1 and first PMOS transistor P1. The second input signal INP1 may be supplied to the gates of the second NMOS transistor Q2 and second PMOS transistor P2.

The drains of the first and second NMOS transistors Q1 and Q2 may be connected to corresponding ones of first and second nodes N1 and N2 of a first current mirror 122, which will be described later.

The drains of the first and second PMOS transistors P1 and P2 may be connected to corresponding ones of third and fourth nodes N3 and N4 of a second current mirror 124, which will be described later.

For example, the first current I1 may be a current flowing between the drain of the first NMOS transistor Q1 and the first node N1. The second current I2 may be a current flowing between the drain of the second NMOS transistor Q2 and the second node N2. The third current I3 may be a current flowing between the drain of the first PMOS transistor P1 and the third node N3. The fourth current I4 may be a current flowing between the drain of the second PMOS transistor P2 and the fourth node N4.

The first input unit 110a and second input unit 110b may have the same configuration. For example, the second input unit 110b may also include first and second differential amplifiers. The first to fourth currents of the first input unit 110a and the configurations of the first and second differential amplifiers of the first input unit 110a may be reproduced in the second input unit 110b in the same manner as the first input unit 110a.

The first amplifying unit 120a outputs control signals VOPH and VONH from the first and second output nodes NO1 and NO2, based on the first to fourth currents I1 to I4.

The first amplifying unit 120a may include a first current mirror 122, a second current mirror 124, and a third bias unit 126. Each of the first and second current mirrors 122 and 124 may comprise a cascode current mirror.

In the first amplifying unit 120a, the first current mirror 122 may include first and second transistors M1 and M2 connected in series at the first node N1, configured to receive the first current I1, and third and fourth transistors M3 and M4 connected in series at the second node N2, configured to receive the second current I2. The second current mirror 124 may include fifth and sixth transistors M5 and M6 connected in series at the third node N3, configured to receive the third current I3, and seventh and eighth transistors M7 and M8 connected in series at the fourth node N4, configured to receive the fourth current I4. The third bias unit 126 may be connected between the first current mirror 122 and the second mirror 124.

The first current mirror 122 controls a voltage at the first output node NO1 in response to at least one of the first and second currents I1 and I2, and a bias control voltage VBP2. In turn, the voltage at the first output node NO1 controls a P type transistor M9 of the first output buffer unit 130a.

For example, in the first current mirror 122, the first and second transistors M1 and M2 may be connected at the first node N1, in series between the second supply voltage VDD2 and a first intermediate node NP1. The first node N1 is configured to receive the first current I1. In addition, the third transistor M3 is connected between the second supply voltage VDD2 and the second node N2, which is configured to receive the second current I2. The fourth transistor M4 is connected to the first output node NO1.

The gates of the first and third transistors M1 and M3 may be connected, and the gates of the second and fourth transistors M2 and M4 may be connected. The gate of the first transistor M1 may be connected to the first intermediate node NP1.

In the first current mirror 122, the first and second transistors M1 and M2 may be connected in series between the first rail VDD2 and the first intermediate node NP1. In addition, the third and fourth transistors M3 and M4 may be connected in series between the first rail VDD2 and the first output node NO1.

The gate of the first transistor M1 may be connected to the gate of the third transistor M3. The gate of the second transistor M2 may be connected to the gate of the fourth transistor M4. The gate of the first transistor M1 may be connected to the source or drain of the second transistor M2.

The second current mirror 124 controls a voltage at the first output node NO2 in response to at least one of the third and fourth currents I3 and I4, and a bias control voltage VBN2. In turn, the voltage at the first output node NO2 controls an N type transistor M10 of the first output buffer unit 130a.

For example, in the second current mirror 124, the fifth and sixth transistors M5 and M6 may be connected at the third node N3, in series between the first supply voltage VSS2 and a second intermediate node NP2. The third node N3 is configured to receive the third current I3. In addition, the seventh transistor M7 is connected between the first supply voltage VSS2 and the fourth node N4, which is configured to receive the fourth current I4. The eighth transistor M8 is connected to the second output node NO2.

The gates of the fifth and seventh transistors M5 and M7 may be connected, and the gates of the sixth and eighth transistors M6 and M8 may be connected. The gate of the fifth transistor M5 may be connected to the second intermediate node NP2.

In the second current mirror 124, the fifth and sixth transistors M5 and M6 may be connected in series between the second rail VSS2 and the second intermediate node NP2. In addition, the seventh and eighth transistors M7 and M8 may be connected in series between the second rail VSS2 and the second output node NO2.

The gate of the fifth transistor M5 may be connected to the gate of the seventh transistor M7. The gate of the sixth transistor M6 may be connected to the gate of the eighth transistor M8. The gate of the fifth transistor M5 may be connected to the source or drain of the sixth transistor M6.

The first intermediate node NP1 and first output node NO1 may be connection nodes between the first current mirror 122 and the third bias unit 126, respectively. The second intermediate node NP2 and second output node NO2 may be connection nodes between the second current mirror 124 and the third bias unit 126, respectively.

For example, the first intermediate node NP1 may be a connection node between the second transistor M2 and a first bias circuit 126a, whereas the first output node NO1 may be a connection node between the fourth transistor M4 and a second bias circuit 126b. In addition, the second intermediate node NP2 may be a connection node between the fifth transistor M5 and the first bias circuit 126a, whereas the second output node NO2 may be a connection node between the seventh transistor M7 and the second bias circuit 126b.

The first node N1 of the first current mirror 122 may be a connection node between the first and second transistors M1 and M2, whereas the second node N2 of the first current mirror 122 may be a connection node between the third and fourth transistors M3 and M4.

The third node N3 of the second current mirror 124 may be a connection node between the fifth and sixth transistors M5 and M6 connected in series, whereas the fourth node N4 of the second current mirror 124 may be a connection node between the seventh and eighth transistors M7 and M8 connected in series.

The third bias unit 126 may also be referred to as a "floating current source". The third bias unit 126 may include the first bias circuit 126a and the second bias circuit 126b.

The first bias circuit 126a may be connected between the second transistor M2 of the first current mirror 122 and the sixth transistor M6 of the second current mirror 124.

The second bias circuit 126b may be connected between the fourth transistor M4 of the first current mirror 122 and the eighth transistor M8 of the second current mirror 124.

The first bias circuit 126a may include an N type transistor and a P type transistor connected in parallel. The source and drain terminals of each of the N type transistor and P type transistor in the first bias circuit 126a may be connected between the first intermediate node NP1 and the second intermediate node NP2.

To each gate of the N type transistor and P type transistor in the first bias circuit 126a, a corresponding one of bias voltages VBN3 and VBP3 may be supplied.

The second bias circuit 126b may include an N type transistor and a P type transistor connected in parallel. The source and drain terminals of each of the N type transistor and P type transistor in the second bias circuit 126b may be connected between the first output node NO1 and the second output node NO2.

To each gate of the N type transistor and P type transistor in the second bias circuit 126b, a corresponding one of bias voltages VBPH3 and VBNH3 may be supplied.

The second amplifying unit 120b outputs control signals VOPL and VBNL from first and second output nodes NO3 and NO4, based on the first and fourth currents I11 to I14.

The second amplifying unit 120b may include a first current mirror 122', a second current mirror 124', and a third bias unit 126'. Each of the first and second current mirrors 122' and 124' may comprise a cascode current mirror. The second amplifying unit 120b may have the same configuration as the first amplifying unit 120a.

Descriptions of the first to fourth nodes N1 to N4, first and second intermediate nodes NP1 and NP2, first and second output nodes NO1 and NO2, first to fourth currents I1 to I4, and output signals VOPH and VONH in the first amplifying unit 120a may also apply to the second amplifying unit 120b in the same manner as for the first amplifying unit 120a.

The first output buffer unit 130a includes the P type transistor M9 and N type transistor M10 connected in series. The first output buffer unit 130a is connected at one end thereof to the second supply voltage VDD2, and at another end thereof to a third supply voltage VDD2M.

For example, the P type transistor M9 of the first output buffer 130a may be connected at a first source/drain terminal thereof to the second supply voltage VDD2, and at a second source/drain terminal thereof to a first source/drain terminal of the N type transistor M10. The N type transistor M10 may be connected at a second source/drain terminal thereof to the third supply voltage VDD2M.

The first and second output nodes NO1 to NO4 of the first and second amplifying blocks or units 120a and 120b may be connected to corresponding ones of the gates of the P type and N type transistors in the first and second output buffer units 130a and 130b, respectively.

Output signals VOPH and VONH on the first and second output nodes NO1 and NO2 of the first amplifying unit 120a control the first output buffer unit 130a.

For example, respective output signals VOPH and VONH on the first and second output nodes NO1 and NO2 of the first amplifying unit 120a may be supplied to the gates of the P type transistor M9 and N type transistor M10 in the first output buffer unit 130a, respectively.

The second output buffer unit 130b includes a P type transistor M9' and an N type transistor M10' connected in series. The second output buffer unit 130b is connected at one end thereof to the third supply voltage VDD2M, and at another end thereof to the first supply voltage VSS2.

For example, the P type transistor M9' of the second output buffer 130b may be connected at a first source/drain terminal thereof to the third supply voltage VDD2M, and at a second source/drain terminal thereof to a first source/drain terminal of the N type transistor M10'. The N type transistor M10' may be connected at a second source/drain terminal thereof to the first supply voltage VSS2.

Output signals VOPL and VONL on the first and second output nodes NO3 and NO4 of the second amplifying unit 120b control the second output buffer unit 130b.

For example, respective output signals VOPL and VONL on the first and second output nodes NO3 and NO4 of the second amplifying unit 120b may be supplied to the gates of the P type transistor M9' and N type transistor M10' in the second output buffer unit 130b, respectively.

The P type transistor M9 of the first output buffer unit 130a may be connected to the second supply voltage VDD2 at a body terminal, a body region or a bulk region of the transistor M9.

The N type transistor M10 of the first output buffer unit 130a may be connected to the third supply voltage VDD2M at a body terminal, a body region or a bulk region of the transistor M10.

The P type transistor M9' of the second output buffer unit 130b may be connected to the third supply voltage VDD2M at a body terminal, a body region or a bulk region of the transistor M9'.

The N type transistor M10' of the second output buffer unit 130b may be connected to the first supply voltage VSS2 at a body terminal, a body region or a bulk region of the transistor M10'.

Respective outputs from the first and second output buffer units 130a and 130b may be fed back to the first and second input units 110a and 110b, respectively.

The output VOUT1 from the first output buffer unit 130a may be fed back to the first input unit 110a, as the second input signal INP1. The output VOUT2 from the second output buffer unit 130b may be fed back to the second input unit 110b, as the second input signal INP2.

The second and fourth nodes N2 and N4 of the first amplifying block may be selectively connected to first source/drain terminals of fourth and eighth transistors M4' and M8' in the second amplifying block, based on or depending on the value of an inversion polarity signal POL. Second and fourth nodes N12 and N14 of the second amplifying block may be selectively connected to the first source/drain terminals of the fourth and eighth transistors M4 and M8 in the first amplifying block, based on or depending on the value of the inversion polarity signal POL.

For example, the second node of the first amplifying block may be connected to the first source/drain terminal of the fourth transistor in one of the first and second amplifying blocks, based on or depending on the value of the inversion polarity signal POL. The fourth node of the first amplifying block may be connected to the first source/drain terminal of the eighth transistor in one of the first and second amplifying blocks, based on or depending on the value of the inversion polarity signal POL.

In addition, the second node of the second amplifying block may be connected to the first source/drain terminal of the fourth transistor in the other of the first and second amplifying blocks, based on or depending on the value of the inversion polarity signal POL. The fourth node of the second amplifying block may be connected to the first source/drain terminal of the eighth transistor in the other of the first and second amplifying blocks, based on or depending on the value of the inversion polarity signal POL.

The switching unit 140 may connect the second and fourth nodes N2 and N4 of the first amplifying unit 120a and the second and fourth nodes N12 and N14 of the second amplifying unit 120b to selected ones of first source/drain terminals 101 and 102 of the fourth and eighth transistors M4 and M8 in the first amplifying unit 120a and first source/drain terminals 103 and 104 of the fourth and eighth transistors M4' and M8' in the second amplifying unit 120b, in response to an inversion polarity signal POL, respectively.

For example, the switching unit 140 may connect the second and fourth nodes N2 and N4 or N12 and N14 in one of the first and second amplifying blocks to selected ones of the source and drain terminals in the fourth and eighth transistors in one of the first and second amplifying blocks, respectively. At the same time, the switching unit 140 may connect the second and fourth nodes N2 and N4 or N12 and N14 in the other of the first and second amplifying blocks to selected ones of the source and drain terminals in the fourth and eighth transistors in the other of the first and second amplifying blocks, respectively.

Figure 4A:
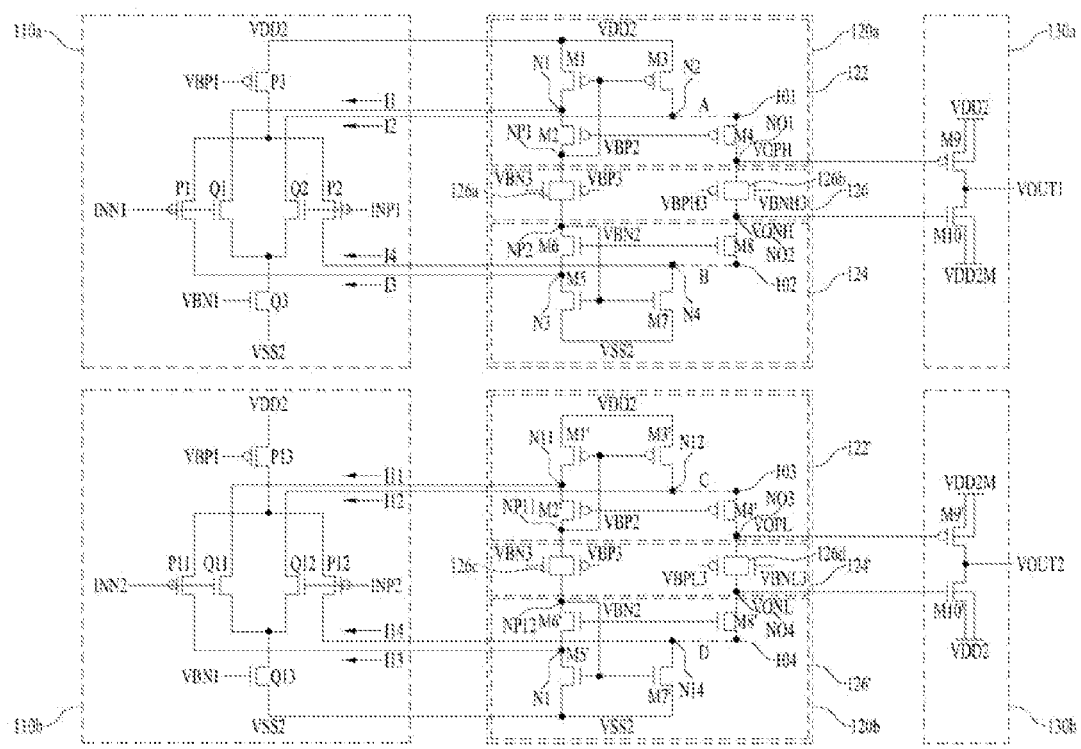
FIG. 4A is a circuit diagram illustrating a first connection between second and fourth nodes and first source/drain terminals in fourth and eighth transistors by the exemplary switching unit of FIG. 1.

FIG. 4A illustrates a schematic representing the circuits resulting from making first connections between the second and fourth nodes N2, N4, N12 and N14 and the first source/drain terminals 101 to 104 in the fourth and eighth transistors M4, M8, M4' and M8' by the switching unit 140 of FIG. 1.

Referring to FIG. 4A, the switching unit 140 may connect the first source/drain terminals 101 and 102 of the fourth and eighth transistors M4 and M8 in the first amplifying unit 120a to the second and fourth nodes N2 and N4 of the first amplifying unit 120a, respectively, in a first frame of the display device.

At the same time, the switching unit 140 may connect the first source/drain terminals 103 and 104 of the fourth and eighth transistors M4' and M8' in the second amplifying unit 120b to the second and fourth nodes N12 and N14 of the second amplifying unit 120b, respectively.

Figure 4B:
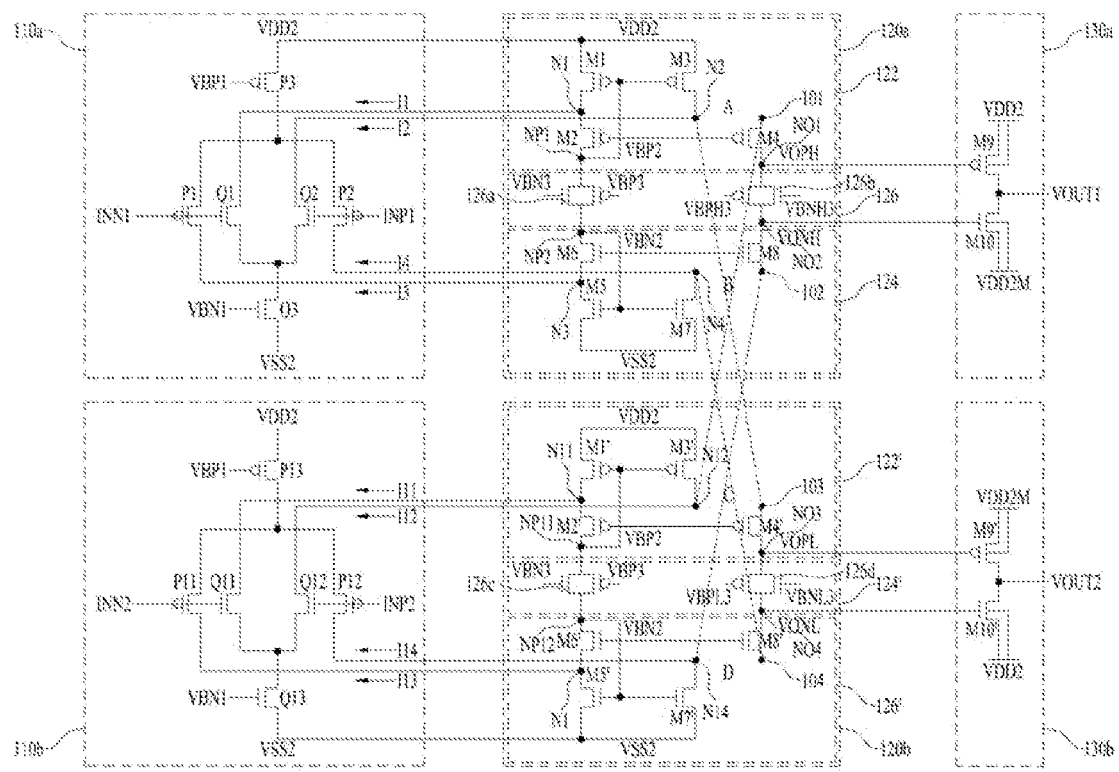
FIG. 4B is a circuit diagram illustrating a second connection between the second and fourth nodes and the first source/drain terminals in the fourth and eighth transistors by the exemplary switching unit of FIG. 1.

FIG. 4B illustrates a schematic representing the circuits resulting from making second connections between the second and fourth nodes N2, N4, N12 and N14 and the first source/drain terminals 101 to 104 in the fourth and eighth transistors M4, M8, M4' and M8' by the switching unit 140 of FIG. 1.

Referring to FIG. 4B, the switching unit 140 may connect the first source/drain terminals 101 and 102 of the fourth and eighth transistors M4 and M8 in the first amplifying unit 120a to the second and fourth nodes N12 and N14 of the second amplifying unit 120b, respectively, in a second frame of the display device.

At the same time, the switching unit 140 may connect the first source/drain terminals 103 and 104 of the fourth and eighth transistors M4' and M8' in the second amplifying unit 120b to the second and fourth nodes N2 and N4 of the first amplifying unit 120a, respectively.

Figure 5:
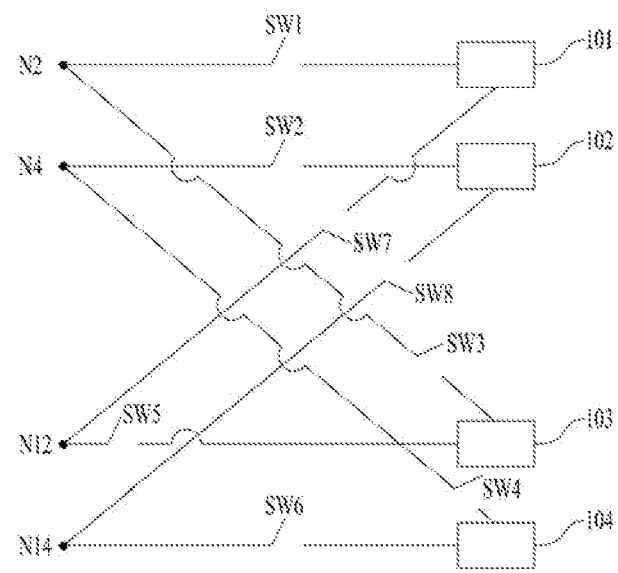
FIG. 5 is a diagram illustrating an embodiment of the switching unit illustrated in FIG. 1.

FIG. 5 illustrates an embodiment of the switching unit 140 illustrated in FIG. 1.

Referring to FIG. 5, the switching unit 140 includes first to eighth switches SW1 to SW4 and SW1' and SW4'.

For example, the first switch SW1 may be connected between the second node N2 of the first amplifying unit 120a and the first source/drain terminal 101 of the fourth transistor M4 in the first amplifying unit 120a.

The second switch SW2 may be connected between the fourth node N4 of the first amplifying unit 120a and the first source/drain terminal 101 of the eighth transistor M8 in the first amplifying unit 120a.

The third switch SW3 may be connected between the second node N2 of the first amplifying unit 120a and the first source/drain terminal 103 of the fourth transistor M4' in the second amplifying unit 120b.

The fourth switch SW4 may be connected between the fourth node N4 of the first amplifying unit 120a and the first source/drain terminal 104 of the eighth transistor M8' in the second amplifying unit 120b.

The fifth switch SW5 may be connected between the second node N12 of the second amplifying unit 120b and the first source/drain terminal 103 of the fourth transistor M4' in the second amplifying unit 120b.

The sixth switch SW6 may be connected between the fourth node N14 of the second amplifying unit 120b and the first source/drain terminal 104 of the eighth transistor M8' in the second amplifying unit 120b.

The seventh switch SW7 may be connected between the second node N12 of the second amplifying unit 120b and the first source/drain terminal 101 of the fourth transistor M4 in the first amplifying unit 120a.

The eighth switch SW8 may be connected between the fourth node N14 of the second amplifying unit 120b and the first source/drain terminal 102 of the eighth transistor M8 in the first amplifying unit 120a.

The first to eighth switches SW1 to SW8 may perform a switching operation (e.g., electrically connect or disconnect a corresponding node and source/drain terminal) in response to an inversion polarity signal POL.

In a first frame of the display device, the first and second switches SW1 and SW2 and the fifth and sixth switches SW5 and SW6 may turn on, whereas the third and fourth switches SW3 and SW4 and the seventh and eighth switches SW7 and SW8 may turn off, in response to the inversion polarity signal POL having a first state or value. As such, the first connection described with reference to FIG. 4A may be achieved.

On the other hand, in a second frame of the display device, the first and second switches SW1 and SW2 and the fifth and sixth switches SW5 and SW6 may turn off, whereas the third and fourth switches SW3 and SW4 and the seventh and eighth switches SW7 and SW8 may turn on, in response to the inversion polarity signal POL having a second state or value (e.g., opposite or complementary to the first state or value). As such, the second connection described with reference to FIG. 4B may be achieved.

Figure 2:
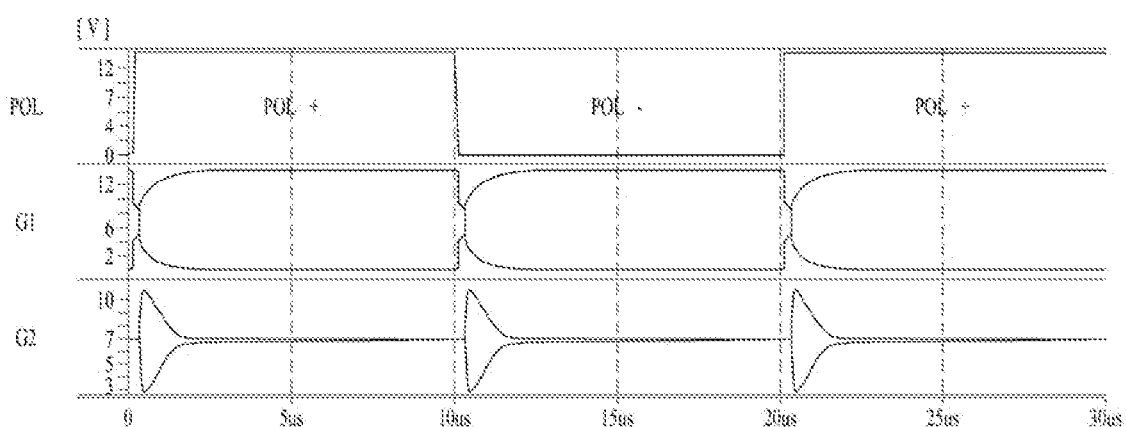
FIG. 2 is a waveform diagram illustrating waveforms of outputs generated from first and second buffer output units according to selective connection(s) made in response to an inversion polarity signal.

FIG. 2 illustrates waveforms of outputs generated from the first and second buffer output units in a comparative according to connections made in response to the inversion polarity signal POL.

Here, "connections" may mean connections between the output nodes NO1, NO2, NO3 and NO4 of the first and second amplifying units 120a and 120b and corresponding inputs of the transistors M9, M10, M9' and M10' in the first and second buffer units 130a and 130b.

Figure 6:
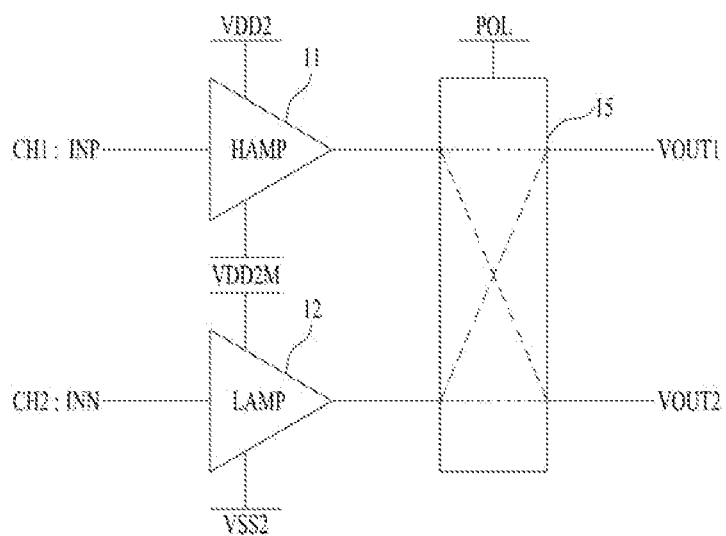
FIG. 6 is a circuit diagram illustrating a general half-power output buffer.

The connections may be made in the same manner as described with reference to FIG. 6.

Meanwhile, the output nodes NO1, NO2, NO3 and NO4 of the first and second amplifying units 120a and 120b may be substituted by the second and fourth nodes N2, N4, N12 and N14 of the first and second amplifying units 120a and 120b in the present embodiments. In addition, the ends of the second bias circuits 126b and 126d in the first and second amplifying units 120a and 120b may be substituted by the first source/drain terminals 101 to 104 of the fourth and eighth transistors M4, M8, M4' and M8' illustrated in FIGS. 4A and 4B.

Referring to FIG. 2, "G1" depicts outputs VOUT1 and VOUT2 generated from the first and second buffer output units 130a and 130b in response to the inversion polarity signal POL. The outputs VOUT1 and VOUT2 may thus form a differential output signal having an output voltage approximate to the second supply voltage VDD2. In such a differential signal, the waveform "G1" represents a high binary logic state or a digital "1".

"G2" depicts outputs VOUT1 and VOUT2 from the first and second buffer output units 130a and 130b in response to the inversion polarity signal POL. The outputs VOUT1 and VOUT2 may thus form a differential output signal having an output voltage approximate to the third supply voltage VDD2M. In such a differential signal, the waveform "G2" represents a low binary logic state or a digital "0".

Referring to G2, after a transition of the inversion polarity signal POL, it may be seen that the outputs VOUT1 and VOUT2 of the first and second output buffer units 130a and 130b initially rise to the second supply voltage VDD2 and fall to the first supply voltage VSS2 before converging to the third supply voltage VDD2M. Due to the abnormal output swing characteristics of the waveform G2, the intended low binary logic state may be inadvertently read as a high binary logic state, and degradation of picture quality may occur in a display panel during operation of a high-frequency and high-resolution display device.

When the inversion polarity signal POL is inverted, the connections between the output nodes NO1, NO2, NO3 and NO4 of the first and second amplifying units 120a and 120b and the first and second output buffer units 130a and 130b may be switched. For example, the output nodes NO1 and NO2 of the first amplifying unit 120a may be disconnected from the first output buffer unit 130a and connected to the second output buffer unit 130b, and the output nodes NO3 and NO4 of the second amplifying unit 120b may be disconnected from the second output buffer unit 130b and connected to the first output buffer unit 130a, thus effectively changing the positions of the output nodes NO1 and NO2 of the first amplifying unit 120a with the output nodes NO3 and NO4 of the second amplifying unit 120b.

There are potential differences between the differential output VOPH/VONH on the output nodes NO1 and NO2 in the first amplifying unit 120a and the differential output VOPL/VONL on the output nodes NO3 and NO4 in the second amplifying unit 120b and, as such, it may be impossible to control the first and second output buffer units 130a and 130b during a certain switching period (e.g., during and immediately after the transition of the inversion polarity signal POL, up to about 1-1.5 μsec after the transition). In this case, degradation of picture quality may occur in the display panel.

For example, the potentials of the output nodes NO1 and NO2 in the first amplifying unit 120a and/or of the output nodes NO3 and NO4 in the second amplifying unit 120b that control the outputs VOUT1 of the first output buffer unit 130a and VOUT2 of the second output buffer unit 130b may be in the wrong state immediately prior to the transition of the inversion polarity signal POL. As such, the outputs VOUT1 and VOUT2 from the first and second output buffer units 130a and 130b during the period immediately after the transition of the inversion polarity signal POL may have levels of the second supply voltage VDD2 and first supply voltage VSS2. As a result, an abnormal output swing between the first and second supply voltages VSS2 and VDD2 relative to the voltages of the input signals INN1 and INN2 may be generated from the first and second output buffer units 130a and 130b.

Figure 3:
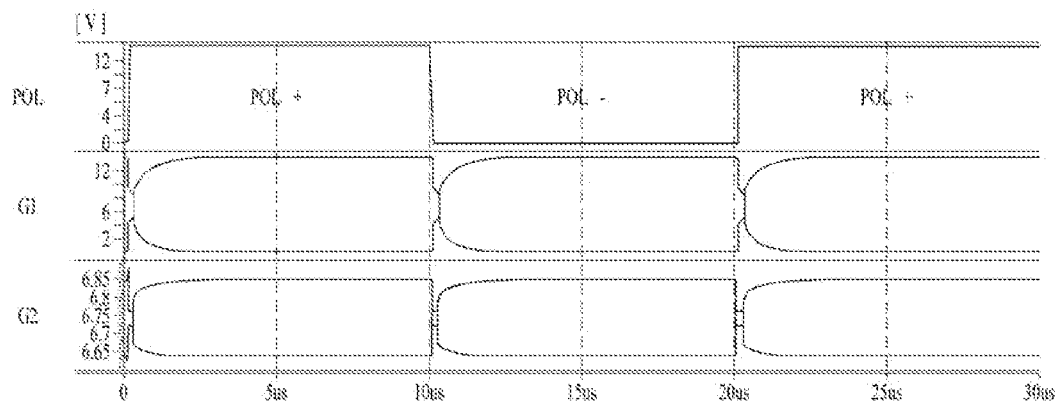
FIG. 3 is a waveform diagram illustrating waveforms of outputs generated from first and second buffer output units according to the exemplary embodiment of FIG. 1.

FIG. 3 illustrates waveforms of outputs VOUT1 and VOUT2 generated from the first and second buffer output units 130a and 130b according to the embodiment of FIG. 1. "G3" depicts outputs VOUT1 and VOUT2 from the first and second buffer output units 130a and 130b in response to the inversion polarity signal POL. The outputs VOUT1 and VOUT2 may thus form a differential output signal having an output voltage approximate to the second supply voltage VDD2. In such a differential signal, the waveform "G3" represents a high binary logic state or a digital "1". "G4" depicts outputs VOUT1 and VOUT2 from the first and second buffer output units 130a and 130b in response to an inversion polarity signal POL. The outputs VOUT1 and VOUT2 may thus form a differential output signal having an output voltage approximate to the third supply voltage VDD2M. In such a differential signal, the waveform "G4" represents a low binary logic state or a digital "0".

In the case of FIG. 2, the output nodes NO1 and NO2 of the first amplifying unit 120a and the output nodes NO3 and NO4 of the second amplifying unit 120b function as switching nodes, effectively changing positions with each other.

On the other hand, in the present embodiment(s), the second and fourth nodes N2 and N4 of the first amplifying unit 120a and the second and fourth nodes N12 and N14 of the second amplifying unit 120b function as switching nodes, effectively changing positions with each other in response to the inversion polarity signal POL.

Generally, responses of the first and second output buffer units 130a and 130b according to potential variations of the output nodes NO1, NO2, NO3 and NO4 in the first and second amplifying units 120a and 120b may be very sensitive because the outputs VOPH, VONH, VOPL and VONL of the output nodes N01, NO2, NO3 and NO4 in the first and second amplifying units 120a and 120b are nodes directly controlling the first and second output buffer units 130a and 130b.

Since the second and fourth nodes N2, N4, N12 and N14 in the first and second amplifying units 120a and 120b are controlled by drain-source voltages of the transistors M3 and M8 connected to the first and second supply voltages VSS2 and VDD2, the potentials of the second and fourth nodes N2, N4, N12 and N14 in the first and second amplifying units 120a and 120b are substantially constant, irrespective of the outputs VOPH, VONH, VOPL and VONL of the first and second amplifying units 120a and 120b. Accordingly, switching noise and voltage variations occurring during switching of the nodes may be reduced or eliminated. Thus, in the present embodiment(s), there may be no abnormal output swings from the first and second output buffer units 130a and 130b when the second and fourth nodes N2 and N4 of the first amplifying unit 120a and the second and fourth nodes N12 and N14 of the second amplifying unit 120b are switched to effectively change positions with each other in response to polarity inversion.

Referring to FIG. 3, it may be seen that no abnormal output swing is exhibited in waveforms G3 and G4.

As described above, the present embodiment(s) may prevent abnormal output swings upon polarity inversion. In addition, since the first and second input units 110a and 110b, the first and second amplifying units 120a and 120b and the first and second output buffer units 130a and 130b can operate as half-power supply voltage sources, the present embodiment(s) may achieve low-power design and small-area design through use of half power.

The embodiments as described above may include particular features, structures, or characteristics, but not every embodiment necessarily includes the particular features, structures, or characteristics. Furthermore, the particular features, structures or characteristics in each embodiment may be combined in any suitable manner, as would be apparent to one of ordinary skill in the art from this disclosure, in one or more embodiments. Therefore, combinations of features of different embodiments are meant to be within the scope of the invention.

What is claimed is:

1. A half-power buffer and/or amplifier comprising:
   first and second amplifying blocks respectively corresponding to first and second channels; and
   a first output buffer unit controlled by an output from the first amplifying block and a second output buffer unit controlled by an output from the second amplifying block,
   wherein each of the first and second amplifying blocks comprises:
      an input unit configured to amplify a first input signal, thereby outputting first and second currents, and
      an amplifying unit comprising a first current mirror comprising first and second transistors connected in series at a first node, configured to receive the first current, third and fourth transistors connected in series at a second node, configured to receive the first current or a complement thereof, a second current mirror comprising fifth and sixth transistors connected in series at a third node, configured to receive the second current, and seventh and eighth transistors connected in series at a fourth node, configured to receive the second current or a complement thereof, and a bias unit connected between the first current mirror and the second mirror,
   wherein the second and fourth nodes of the first and second amplifying blocks are selectively connected to first source/drain terminals of the fourth and eighth transistors in the first and second amplifying blocks in response to a control signal.

2. The half-power buffer and/or amplifier according to claim 1, wherein:
   each of the first and second output buffer units comprises an N type transistor and a P type transistor, connected in series;
   the first output buffer unit is connected, at one end thereof, to a second supply voltage, at another end thereof, to a third supply voltage, and the second output buffer unit is connected, at one end thereof, to a first supply voltage, at another end thereof, to the third supply voltage; and
   the second supply voltage is higher than the third supply voltage, and the first supply voltage is lower than the third supply voltage.

3. The half-power buffer and/or amplifier according to claim 1, wherein the bias unit comprises:
   a first bias circuit connected between the second transistor of the first current mirror and the sixth transistor of the second current mirror; and
   a second bias circuit connected between the fourth transistor of the first current mirror and the eighth transistor of the second current mirror.

4. The half-power buffer and/or amplifier according to claim 3, wherein each of the first and second bias circuits comprises an N type transistor and a P type transistor, connected in parallel, and a bias voltage is applied to each of gates of the N type and P type transistors.

5. The half-power buffer and/or amplifier according to claim 1, wherein the second and fourth nodes of the first amplifying block are selectively connected to the first source/drain terminals of the fourth and eighth transistors of the second amplifying block, and the second and fourth nodes of the second amplifying block are selectively connected to the first source/drain terminals of the fourth and eighth transistors of the first amplifying block.

6. The half-power buffer and/or amplifier according to claim 1, wherein the second and fourth nodes of one of the first and second amplifying blocks are selectively connected to the first source/drain terminals of the fourth and eighth transistors in one of the first and second amplifying blocks in response to the control signal, and the second and fourth nodes of the other of the first and second amplifying blocks are selectively connected to the first source/drain terminals of the fourth and eighth transistors in the other of the first and second amplifying blocks in response to the control signal.

7. The half-power buffer and/or amplifier according to claim 1, wherein an output from each of the first and second output buffer units is fed back to a corresponding one of the first and second input units.

8. The half-power buffer and/or amplifier according to claim 1, wherein each of the first and second current mirrors is a cascade current mirror.

9. The half-power buffer and/or amplifier according to claim 1, wherein the control signal is an inversion polarity signal.

10. The half-power buffer and/or amplifier according to claim 1, further comprising:
    a first switch connected between the second node of the first amplifying block and the first source/drain terminal of the fourth transistor in the first amplifying block;
    a second switch connected between the fourth node of the first amplifying block and the first source/drain terminal of the eighth transistor in the first amplifying block;
    a third switch connected between the second node of the first amplifying block and the first source/drain terminal of the fourth transistor in the second amplifying block;
    a fourth switch connected between the fourth node of the first amplifying block and the first source/drain terminal of the eighth transistor in the second amplifying block;
    a fifth switch connected between the second node of the second amplifying block and the first source/drain terminal of the fourth transistor in the second amplifying block;
    a sixth switch connected between the fourth node of the second amplifying block and the first source/drain terminal of the eighth transistor in the second amplifying block;
    a seventh switch connected between the second node of the second amplifying block and the first source/drain terminal of the fourth transistor in the first amplifying block; and
    an eighth switch connected between the fourth node of the second amplifying block and the first source/drain terminal of the eighth transistor in the first amplifying block,
    wherein the first to eighth switches perform switching operation in response to the control signal.

11. The half-power buffer and/or amplifier according to claim 1, wherein the first input signal is a differential input signal.

12. The half-power buffer and/or amplifier according to claim 11, wherein the first and second currents are first and second differential currents.

13. The half-power buffer and/or amplifier according to claim 11, further comprising:
a switching unit configured to selectively connect the second and fourth nodes to the first source/drain terminals of the fourth and eighth transistors in response to the control signal.

14. A half-power buffer and/or amplifier comprising:
first and second amplifying blocks respectively corresponding to first and second channels; and
a first output buffer unit controlled by first and second output nodes and a second output buffer unit controlled by third and fourth output nodes;
wherein each of the first and second amplifying blocks comprises
an input unit configured to amplify a first input signal, thereby outputting first and second currents,
a first current mirror comprising first and second transistors connected in series between a second supply voltage and a first intermediate node in series at a first node, configured to receive the first current, a third transistor connected between the second supply voltage and a second node, configured to receive the first current or a complement thereof, a fourth transistor connected to the first output node, the first and third transistors being connected at gates thereof, the second and fourth transistors being connected at gates thereof, the first transistor being connected at a gate thereof to the first intermediate node,
a second current mirror comprising fifth and sixth transistors connected in series between a first supply voltage and a second intermediate node at a third node, configured to receive the second current, a seventh transistor connected between the first supply voltage and a fourth node, configured to receive the second current or a complement thereof, an eighth transistor connected to the second output node, the fifth and seventh transistors being connected at gates thereof, the sixth and eighth transistors being connected at gates thereof, the fifth transistor being connected at a gate thereof to the second intermediate node, and
a bias unit connected between the first intermediate node and the second intermediate node and between the first output node and the second output node,
wherein the second and fourth nodes of each of the first and second amplifying blocks are selectively connected to first source/drain terminals of the fourth and eighth transistors in a corresponding one of the first and second amplifying blocks.

15. The half-power buffer and/or amplifier according to claim 14, wherein the second node of the first amplifying block is connected to the first source/drain terminal of the fourth transistor in one of the first and second amplifying blocks in response to the control signal, the fourth node of the first amplifying block is connected to the first source/drain terminal of the eighth transistor in one of the first and second amplifying blocks in response to the control signal, the second node of the second amplifying block is connected to the first source/drain terminal of the fourth transistor in the other of the first and second amplifying blocks in response to the control signal, and the fourth node of the second amplifying block is connected to the first source/drain terminal of the eighth transistor in the other of the first and second amplifying blocks in response to the control signal.

16. The half-power buffer and/or amplifier according to claim 14, wherein:
the first output buffer unit comprises a first P type transistor and a first N type transistor, connected in series between the second supply voltage and a third supply voltage;
the second output buffer unit comprises a second P type transistor and a second N type transistor, connected in series between the first supply voltage and the third supply voltage; and
the first and second output nodes of each of the first and second amplifying blocks are connected to corresponding ones of gates of the first or second P type and N type transistors in a corresponding one of the first and second output buffer units, respectively.

17. The half-power buffer and/or amplifier according to claim 14, wherein the bias unit comprises:
a first bias circuit comprising N type and P type transistors connected in parallel between the first intermediate node and the second intermediate node and receiving a first bias voltage; and
a second bias circuit comprising N type and P type transistors connected in parallel between the first output node and the second output node and receiving a second bias voltage.

18. The half-power buffer and/or amplifier according to claim 14, wherein the first input signal is a differential input signal.

19. The half-power buffer and/or amplifier according to claim 18, wherein the first and second currents are first and second differential currents.

* * * * *